(12) United States Patent
Togashi

(10) Patent No.: US 8,994,476 B2
(45) Date of Patent: Mar. 31, 2015

(54) MULTILAYER ELECTRONIC COMPONENT AND MOUNTED STRUCTURE OF ELECTRONIC COMPONENT

(75) Inventor: Masaaki Togashi, Tokyo (JP)

(73) Assignee: TDK Corporation, Tokyo (JP)

( * ) Notice: Subject to any disclaimer, the term of this patent is extended or adjusted under 35 U.S.C. 154(b) by 418 days.

(21) Appl. No.: 13/354,794

(22) Filed: Jan. 20, 2012

(65) Prior Publication Data

US 2012/0188028 A1 Jul. 26, 2012

(30) Foreign Application Priority Data

Jan. 24, 2011 (JP) ................. P2011-012026

(51) Int. Cl.
*H03H 7/01* (2006.01)
*H01F 17/00* (2006.01)
*H03H 1/00* (2006.01)

(52) U.S. Cl.
CPC .......... *H01F 17/0006* (2013.01); *H03H 1/0007* (2013.01); *H01F 2017/0066* (2013.01)
USPC .......................................... 333/185; 336/200

(58) Field of Classification Search
CPC ............ H01F 27/2804; H01F 17/0006; H01F 17/0013; H01F 2017/0066; H01F 1/0013; H03H 1/0007; H03H 7/01
USPC .............. 333/12, 167, 175, 181, 185; 336/200
See application file for complete search history.

(56) References Cited

U.S. PATENT DOCUMENTS 7,432,784 B2 * 10/2008 Togashi ................. 333/185

FOREIGN PATENT DOCUMENTS

| JP | A-61-047605 | 3/1986 |
| JP | A-61-112395 | 5/1986 |
| JP | A-02-210805 | 8/1990 |
| JP | A-10-208963 | 8/1998 |
| JP | A-2006-086216 | 3/2006 |
| JP | A-2007-234755 | 9/2007 |
| JP | A-2009-176829 | 8/2009 |
| JP | A-2010-246075 | 10/2010 |
| JP | A-2010-279010 | 12/2010 |

OTHER PUBLICATIONS

English-language translation of Dec. 4, 2012 Office Action issued in Japanese Patent Application No. P2011-012026.

* cited by examiner

*Primary Examiner* — Benny Lee
*Assistant Examiner* — Jorge Salazar, Jr.
(74) *Attorney, Agent, or Firm* — Oliff PLC

(57) ABSTRACT

A ferrite bead inductor comprises a ferrite bead element body having magnetic layers and inner electrodes stacked therein, and first and second outer electrodes arranged on first and second side faces of the ferrite bead element body. The inner electrode extends in the direction of shorter sides which are shorter than longer sides, so as to connect with the first and second outer electrodes. The ferrite bead element body has an interstice for allowing the magnetic layers adjacent to each other in the stacking direction to join together within an inner electrode region adapted to form the inner electrode on the magnetic layer.

13 Claims, 15 Drawing Sheets

*Fig.8*
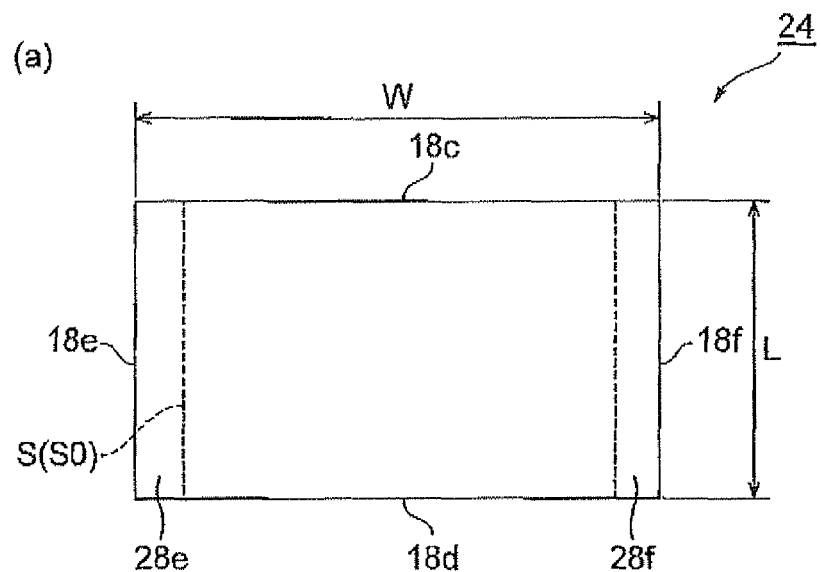
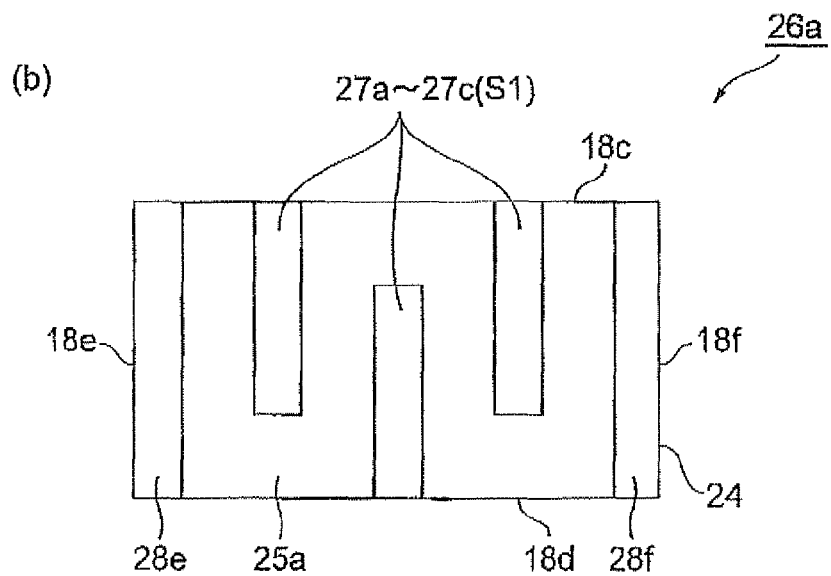

MULTILAYER ELECTRONIC COMPONENT AND MOUNTED STRUCTURE OF ELECTRONIC COMPONENT

The present application claims priority to Japanese Patent Application 2011-012026 filed on Jan. 24, 2011.

BACKGROUND OF THE INVENTION

1. Field of the Invention

The present invention relates to a multilayer electronic component and a mounted structure of an electronic component including the multilayer electronic component. The present invention also relates to a multilayer bead inductor and a mounted structure of the multilayer bead inductor and a multilayer capacitor.

2. Related Background Art

As a noise filter for preventing noises from leaking and entering through wiring for power supplies, signals, and the like, an electronic component combining an inductor and a capacitor is disclosed in Japanese Patent Application Laid-Open No. 2007-234755, for example.

SUMMARY OF THE INVENTION

Recently, as electronic devices have been attaining higher frequencies, components used in the electronic devices have also been demanded to deal with higher frequencies. When a resistance component is enhanced in a high frequency band in order to deal with a high frequency, however, the electronic component disclosed in Japanese Patent Application Laid-Open No. 2007-234755 increases not only resistance in the whole band including DC resistance in a lower frequency band, but also impedance.

Therefore, in Japanese Patent Application No. 2010-279010, the applicant has proposed a mounted structure of an electronic component which can attain higher impedance in a higher frequency band while keeping lower impedance in a lower frequency band. Electronic components suitable for such a mounted structure have been desired.

It is an object of the present invention to provide a multilayer electronic component suitable for a mounted structure which can attain higher impedance in a higher frequency band while keeping lower impedance in a lower frequency band and the like, and a mounted structure of an electronic component including the multilayer electronic component.

The multilayer electronic component in accordance with the present invention comprises a element body, a first outer electrode arranged on a first side face of the element body, and a second outer electrode arranged on a second side face of the element body. The element body includes magnetic layers and an inner electrode stacked such that the inner electrode is arranged between the magnetic layers, while having substantially oblong first and second main faces opposing each other, first and second side faces extending in a longer side direction of the first and second main faces so as to connect the first and second main faces to each other and opposing each other, and third and fourth side faces extending in a shorter side direction of the first and second main faces so as to connect the first and second main faces to each other and opposing each other. In this multilayer electronic component, the inner electrode extends in the direction of the shorter sides shorter than the longer sides so as to connect with first and second outer electrodes, while the element body has a junction where the magnetic layers adjacent to each other in the stacking direction join together within an inner electrode region adapted to form the inner electrode on the magnetic layer.

The mounted structure of an electronic component in accordance with the present invention is a mounted structure of an electronic component connected to power lines for supplying a current. The electronic component comprises a capacitor and a bead inductor which is a multilayer electronic component constructed as mentioned above. In the mounted structure, the capacitor and the bead inductor are connected in series between the power lines.

Since the capacitor and the bead inductor are connected in series between the power lines, the resistance component of the bead inductor acts as the ESR (Equivalent Series Resistance) of the capacitor in the mounted structure. The resistance component of the bead inductor is constituted by the sum of the DC resistance component and the loss increasing in a higher frequency band. Therefore, this mounted structure can increase the impedance in the higher frequency band, thereby favorably removing high frequency noises. On the other hand, the inductor component functions more than the resistance component in a lower frequency band in the bead inductor, whereby the above-mentioned mounted structure can keep impedance low in the lower frequency band. Since the capacitor is mounted in order to deal with low frequency noises, the low frequency noises can be absorbed by the capacitor, so as to be removed favorably.

Meanwhile, in the bead inductor, the first and second outer electrodes are arranged on the first and second side faces, respectively, so that both of the outer electrodes can be made wider, while the inner electrode extends in the shorter side direction so as to connect with both of the outer electrodes and thus can be made shorter. Therefore, using the bead inductor in accordance with the present invention in the above-mentioned mounted structure or the like can reduce the DC resistance component, which is one of constituents of the resistance component of the bead inductor. That is, using this bead inductor can make the ESR further lower and higher in lower and higher frequency bands, respectively.

Thus constructed bead inductor has a junction where the magnetic layers adjacent to each other in the stacking direction join together within an inner electrode region adapted to form the inner electrode. Therefore, the bead inductor can not only achieve lower ESR in the lower frequency band and so forth, but also utilize the junction so as to prevent the magnetic layers from causing interlayer peeling, thereby inhibiting internal defects from occurring in the bead inductor.

In the bead inductor, letting S0 be the area of the inner electrode region on the magnetic layer, and S1 be the area of the junction on the magnetic layer, the area ratio S1/S0 of the junction to the inner electrode region may be greater than 0.20 but 0.67 or less. This can further improve the adhesion between the magnetic layers, so as to more strongly inhibit internal defects from being caused by the interlayer peeling and the like, while keeping the DC resistance of the bead inductor lower.

In the bead inductor, the inner electrode may be divided into a plurality of inner electrodes on the magnetic layer. This can further improve the adhesion between the magnetic layers, so as to more strongly inhibit internal defects from being caused by the interlayer peeling and the like.

In the bead inductor, a plurality of inner electrodes arranged on different magnetic layers may be kept from opposing each other through the magnetic layer located therebetween in the stacking direction. This can further improve the adhesion between the magnetic layers, so as to more strongly inhibit internal defects from being caused by the interlayer peeling and the like.

In the bead inductor, each of the first and second outer electrodes may be constituted by one outer electrode. This can further lower the resistance value in the outer electrodes, whereby the DC resistance component of the bead inductor can be made smaller.

In the above-mentioned mounted structure, the capacitor may comprise a capacitor element body, a first capacitor outer electrode arranged on the first side face side of the capacitor element body, and a second capacitor outer electrode arranged on the second side face side of the capacitor element body. The capacitor element body includes dielectric layers and an inner electrode stacked therein, while having substantially oblong first and second main faces opposing each other, first and second side faces extending in a longer side direction of the first and second main faces so as to connect the first and second main faces to each other and opposing each other, and third and fourth side faces extending in a shorter side direction of the first and second main faces so as to connect the first and second main faces to each other and opposing each other. In this case, the capacitor outer electrodes are arranged on the first and second side faces extending in the longer side direction, whereby ESL (Equivalent Series Inductance) can be lowered. Because of the low ESL, this mounted structure allows unnecessary noises to flow securely to the inductor, so as to be removed more reliably by heat exchange.

In the above-mentioned mounted structure, the first and second capacitor outer electrodes of the capacitor may have a width substantially equal to that of the first and second outer electrodes of the bead inductor. When the outer electrodes of the capacitor and bead inductor have widths different from each other, a high frequency current may be reflected between them without being converted into heat by the resistance component of the bead inductor, which may lower the noise removing effect, for example. Making the outer electrodes of the capacitor and bead inductor have equal widths can prevent the high frequency current from being reflected, so as to improve the noise removing effect in the bead inductor.

In the above-mentioned mounted structure, the electronic component may have a plurality of bead inductors and the plurality of bead inductors are mounted such that respective magnetic fields thereof cancel each other out. That is, the bead inductors may be mounted such that respective currents flow therethrough in directions opposite to each other. This reduces the ESL in the bead inductor, which makes it possible to prevent high frequency noises from being reflected, whereby the high frequency noises can be converted into heat by the resistance component, so as to be removed favorably.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIGS. 8a and 8b are views illustrating inner electrode regions and junctions in the ferrite bead inductor;

DESCRIPTION OF THE PREFERRED EMBODIMENTS

In the following, preferred embodiments of the present invention will be explained in detail with reference to the accompanying drawings. In the explanation, the same constituents or those having the same functions will be referred to with the same signs while omitting their overlapping descriptions.

First Embodiment

Figure 1:
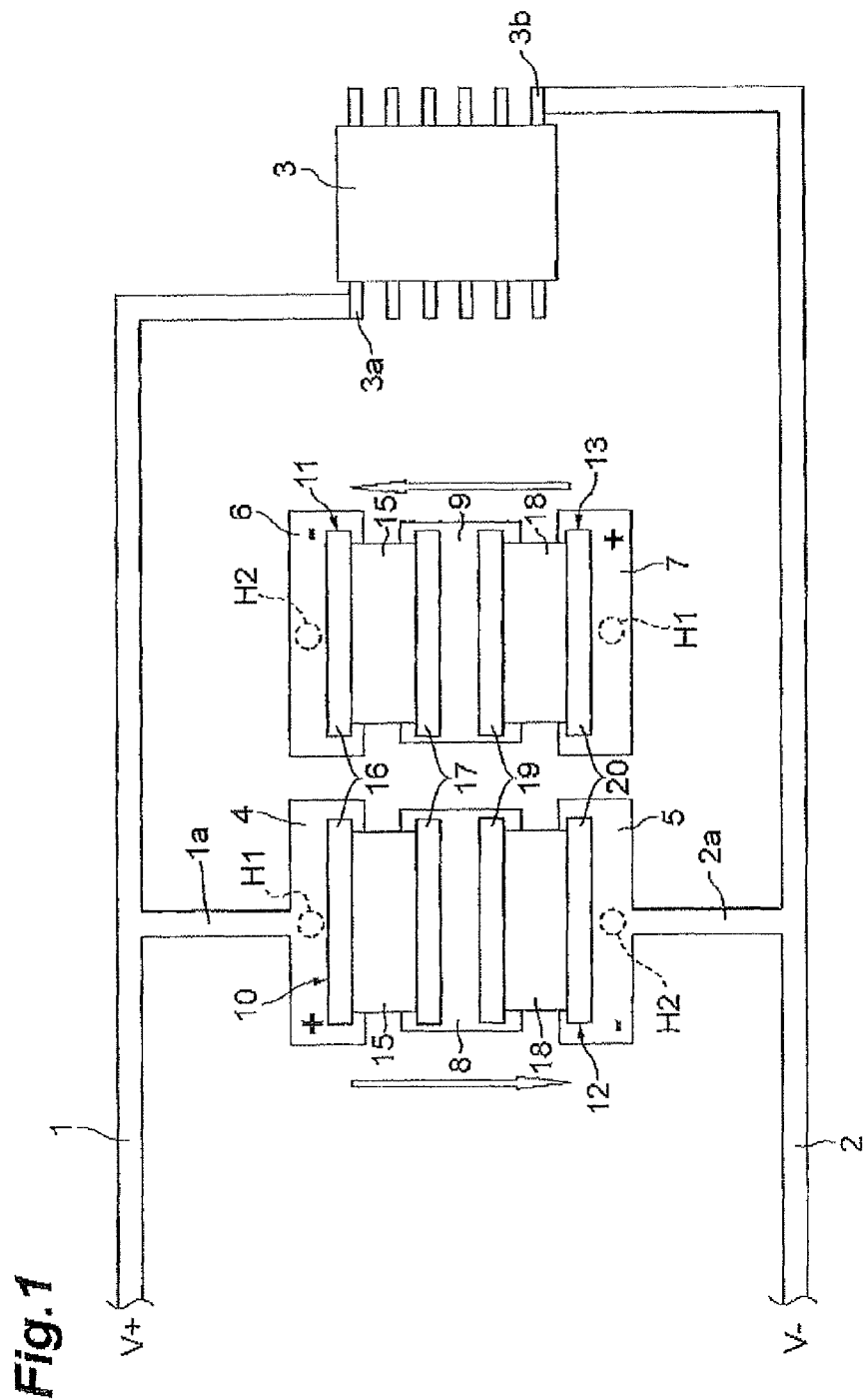
FIG. 1 is a diagram schematically illustrating the mounted structure of an electronic component in accordance with a first embodiment.
Figure 2:
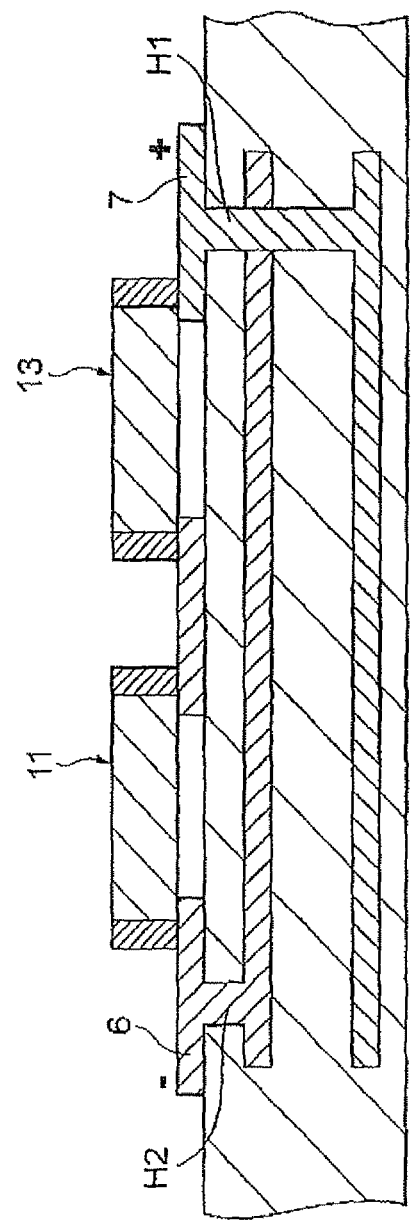
FIG. 2 is a sectional view of the mounted structure of an electronic component illustrated in FIG. 1.

To begin with, the mounted structure of an electronic component in accordance with the first embodiment will be explained. FIG. 1 is a view illustrating the mounted structure of an electronic component in accordance with the first embodiment. FIG. 2 is a sectional view of the mounted structure of an electronic component illustrated in FIG. 1. As these drawings represent, electronic components are mounted to a circuit in which two power lines 1, 2 forming power supply flow paths, an IC (Integrated Circuit) chip 3, first to fourth land electrodes 4 to 7, and connecting electrodes 8, 9 are arranged. In the mounted structure of an electronic component, a plurality of capacitors (chip capacitors) 10, 11 and a plurality of ferrite bead inductors 12, 13 are mounted as electronic components to be connected to the power lines 1, 2. The capacitors 10, 11 and ferrite bead inductors 12, 13 are mounted two each. The capacitors 10, 11 and the ferrite bead inductors 12, 13 are connected in series between the power lines 1, 2.

The power lines 1, 2 are connected to terminal electrodes 3a, 3b of the IC chip 3, respectively. A lead 1a branching out from the power line 1 is connected to the first land electrode 4, while a lead 2a branching out from the power line 2 is connected to the second land electrode 5. The first and second land electrodes 4, 5 oppose each other. The connecting electrode 8 connected to none of the leads 1a, 2a is disposed between the first and second land electrodes 4, 5. The first and second land electrodes 4, 5 and the connecting electrode 8 are arranged on a single line.

In a direction (hereinafter referred to as "second direction") intersecting on the same plane at substantially right angles with a direction (hereinafter referred to as "first direction") in which the first land electrode 4, the connecting electrode 8 and the second land electrode 5 are arranged, the third land electrode 6 is disposed in parallel with and adjacent to (the depicted right side of) the first land electrode 4 with a predetermined gap therebetween. The fourth land electrode 7 is disposed in parallel with and adjacent to (the depicted right side of) the second land electrode 5 with a predetermined gap therebetween. Between the third and fourth land electrodes 6, 7, the connecting electrode 9 is disposed in parallel with and adjacent to the connecting electrode 8 with a predetermined gap therebetween. Each of the first to fourth land electrodes 4 to 7 and connecting electrodes 8, 9 has a rectangular form.

As FIGS. 1 and 2 illustrate, the fourth land electrode 7 is electrically connected to the first land electrode 4 through a via hole H1. The third land electrode 6 is electrically connected to the second land electrode 5 through a via hole H2. Such a structure allows the first and fourth land electrodes 4, 7 to attain the same polarity (positive polarity), and the second and third land electrodes 5, 6 to attain the same polarity (negative polarity). That is, the first and third land electrodes 4, 6 adjacent to each other in the second direction have polarities different from each other, and so do the second and fourth land electrodes 5, 7.

The capacitors 10, 11 have similar structures. That is, each of the capacitors 10, 11 comprises a capacitor element body 15 having a substantially rectangular parallelepiped form and first and second outer electrodes 16, 17 formed on side faces 15c, 15d (see FIG. 3) of the capacitor element body 15, respectively. The capacitor 10 is arranged such as to bridge the first land electrode 4 and the connecting electrode 8. The capacitor 11 is arranged such as to bridge the third land electrode 6 and the connecting electrode 9. That is, the first outer electrode 16 of the capacitor 10 is connected to the first land electrode 4, while its second outer electrode 17 is connected to the connecting electrode 8. The first outer electrode 16 of the capacitor 11 is connected to the third land electrode 6, while its second outer electrode 17 is connected to the connecting electrode 9. The capacitors 10, 11 are mounted to the first and third land electrodes 4, 6 and connecting electrodes 8, 9 by solder or the like.

Because of the foregoing arrangement, the capacitors 10, 11 are mounted close to each other in the second direction. Specifically, the respective directions in which the first and second outer electrodes 16, 17 oppose each other in the capacitors 10, 11 are substantially parallel to each other (oriented in the first direction). The capacitors 10, 11 are also mounted such as to overlap when seen in a direction, i.e., the second direction, intersecting the opposing direction of the first and second outer electrodes 16, 17 on the mounting surface. The outer electrode 16 of the capacitor 10 and the outer electrode 16 of the capacitor 11 are connected to the respective polarities different from each other.

The ferrite bead inductors 12, 13 have similar structures. That is, each of the ferrite bead inductors 12, 13 comprises a ferrite bead element body 18 having a substantially rectangular parallelepiped form and first and second outer electrodes 19, 20 formed on side faces 18c, 18d (see FIG. 5) of the ferrite bead element body 18. The ferrite bead inductor 12 is arranged such as to bridge the connecting electrode 8 and the second land electrode 5. The ferrite bead inductor 13 is arranged such as to bridge the connecting electrode 9 and the fourth land electrode 7. That is, the first outer electrode 19 of the ferrite bead inductor 12 is connected to the connecting electrode 8, while its second outer electrode 20 is connected to the second land electrode 5. The first outer electrode 19 of the ferrite bead inductor 13 is connected to the connecting electrode 9, while its second outer electrode 20 is connected to the fourth land electrode 7. The ferrite bead inductors 12, 13 are mounted to the second and fourth land electrodes 5, 7 and connecting electrodes 8, 9 by solder or the like.

Because of the foregoing arrangement, the ferrite bead inductors 12, 13 are mounted close to each other in the second direction. Specifically, the respective directions in which the first and second outer electrodes 19, 20 oppose each other in the ferrite bead inductors 12, 13 are substantially parallel to each other (oriented in the first direction). The ferrite bead inductors 12, 13 are also mounted such as to overlap when seen in a direction, i.e., the second direction, intersecting the opposing direction of the first and second outer electrodes 19, 20 on the mounting surface. The outer electrode 19 of the ferrite bead inductor 12 and the outer electrode 19 of the ferrite bead inductor 13 are connected to the respective polarities different from each other.

Since the capacitors 10, 11 and ferrite bead inductors 12, 13 are arranged as mentioned above, the second outer electrode 17 of the capacitor 10 and the first outer electrode 19 of the ferrite bead inductor 12 oppose each other, and so do the second outer electrode 17 of the capacitor 11 and the first outer electrode 19 of the ferrite bead inductor 13. Their opposing direction is oriented in the first direction. Thus, between the power lines 1, 2, the capacitor 10 and the ferrite bead inductor 12 are mounted in series, and so are the capacitor 11 and the ferrite bead inductor 13. The capacitors 10, 11 and ferrite bead inductors 12, 13 are connected in parallel to the IC chip 3.

In the mounted structure of an electronic component, currents flow through the capacitors 10, 11 and ferrite bead inductors 12, 13 in the directions of arrows depicted in FIG. 1. That is, a current flows through the capacitor 10 and ferrite bead inductor 12 from the former to the latter. On the other hand, a current flows through the capacitor 11 and ferrite bead inductor 13 from the latter to the former. Here, currents flow in directions opposite to each other through the capacitors 10, 11 adjacent to each other and through the ferrite bead inductors 12, 13 adjacent to each other. As a consequence, magnetic fields cancel each other out between the adjacent capacitors 10, 11 and between the adjacent ferrite bead inductors 12, 13. Therefore, the ESL of the inductor component decreases.

Figure 3:
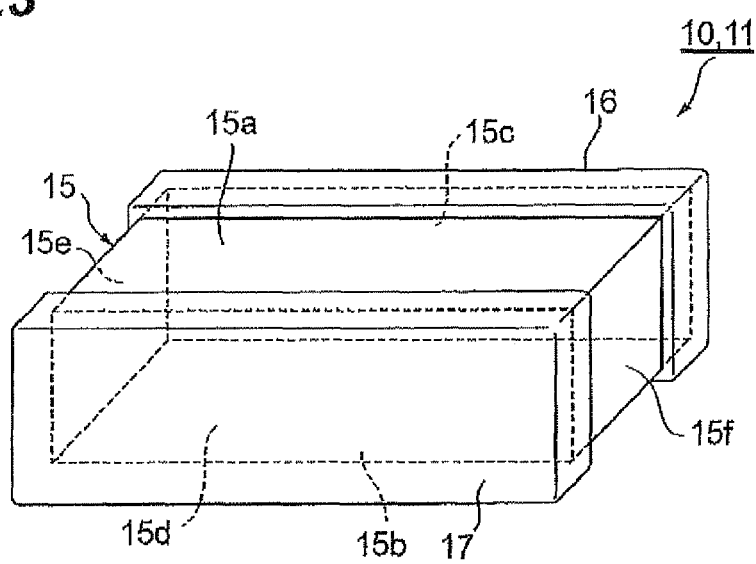
FIG. 3 is a perspective view illustrating the capacitor used in the mounted structure represented in FIG. 1.

The capacitors 10, 11 and ferrite bead inductors 12, 13 will now be explained in detail. First, the capacitors 10, 11 will be explained. FIG. 3 is a perspective view illustrating a capacitor, while FIG. 4 is a view illustrating the layer structure of the capacitor represented in FIG. 3.

Figure 4:
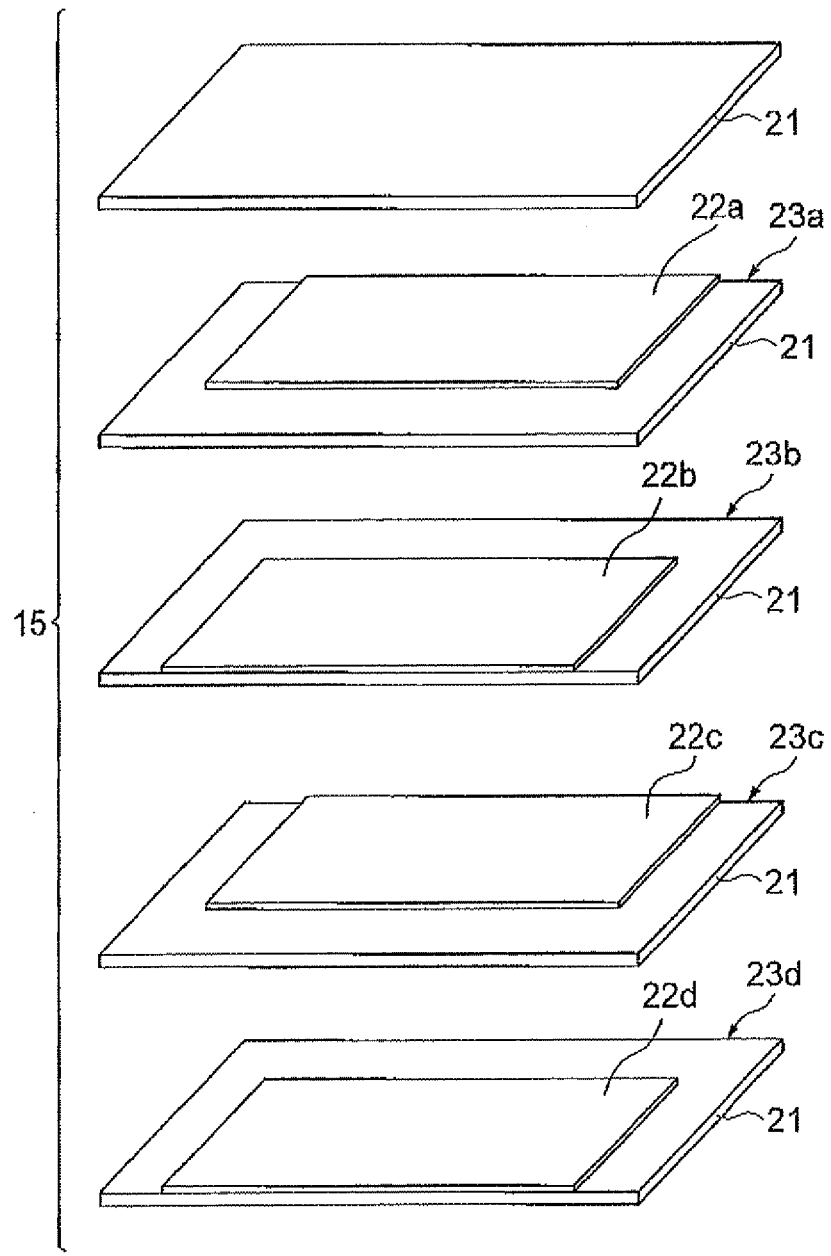
FIG. 4 is a view illustrating the layer structure of the capacitor represented in FIG. 3.

As FIGS. 3 and 4 illustrate, each of the capacitors 10, 11 is a multilayer chip capacitor. As FIG. 3 illustrates, the capacitor element body 15 of the capacitor 10 has oblong first and second main faces 15a, 15b opposing each other, first and second side faces 15c, 15d extending in the longer side direction of the first and second main faces 15a, 15b so as to connect them to each other and opposing each other, and third and fourth side faces 15e, 15f extending in the shorter side direction of the first and second main faces 15a, 15b so as to connect them to each other and opposing each other. The capacitor element body 15 of the capacitor 11 has a structure similar thereto.

The first outer electrode 16 is formed on the first side face 15c side of the capacitor element body 15. The first outer electrode 16 covers the first side face 15c as a whole and continuously a part of the first and second main faces 15a, 15b and third and fourth side faces 15e, 15f. The second outer electrode 17 is formed on the second side face 15d side of the capacitor element body 15. The second outer electrode 17 covers the second side face 15d as a whole and continuously a part of the first and second main faces 15a, 15b and third and fourth side faces 15e, 15f. That is, the first and second outer electrodes 16, 17 are formed such as to be arranged on the longitudinal side faces 15c, 15d of the capacitor element body 15.

As FIG. 4 illustrates, the capacitor element body 15 is constructed by a plurality (4 here) of composite layers 23a to 23d, constituted by substantially oblong dielectric layers 21 and first to fourth inner electrodes 22a to 22d respectively formed thereon, and a dielectric layer 21 mounted as the outermost layer on the composite layers 23a to 23d so as to function as a protective layer. Each of the dielectric layers 21 is made of a sintered body of a ceramic green sheet containing a dielectric ceramic, while each of the first to fourth inner electrodes 22a to 22d is made of a sintered body of a conductive paste. The capacitor element body 15 in practice is integrated to such an extent that boundaries between the dielectric layers 21 are indiscernible.

The composite layer 23a is a layer in which the first inner electrode 22a is formed on the dielectric layer 21. The composite layer 23b is a layer in which the second inner electrode 22b is formed on the dielectric layer 21. The composite layer 23c is a layer in which the third inner electrode 22c is formed on the dielectric layer 21. The composite layer 23d is a layer in which the fourth inner electrode 22d is formed on the dielectric layer 21. The first to fourth inner electrodes 22a to 22d alternate with the dielectric layers 21 in their stacking direction. As a consequence, the first to fourth inner electrodes 22a to 22d oppose one another through the dielectric layers 21 partly constituting the capacitor element body 15.

The first inner electrode 22a has an oblong form and is arranged within the capacitor element body 15 such as to have the longer side direction parallel to that of the first and second main faces 15a, 15b of the capacitor element body 15. While keeping the oblong form, the first inner electrode 22a extends such as to be drawn to the first side face 15c of the capacitor element body 15, thereby connecting with the first outer electrode 16 electrically and mechanically. The first inner electrode 22a is arranged such as to be separated from the second to fourth side faces 15d to 15f by predetermined distances. The length of the first inner electrode 22a in the opposing direction of the third and fourth side faces 15e, 15f is substantially constant along the opposing direction of the first and second side faces 15c, 15d. The third inner electrode 22c has a structure similar to that of the first inner electrode 22a.

The second inner electrode 22b has an oblong form and is arranged within the capacitor element body 15 such as to have the longer side direction parallel to that of the first and second main faces 15a, 15b of the capacitor element body 15. While keeping the oblong form, the second inner electrode 22b extends such as to be drawn to the second side face 15d of the capacitor element body 15, thereby connecting with the second outer electrode 17 electrically and mechanically. The second inner electrode 22b is arranged such as to be separated from the first, third, and fourth side faces 15c, 15e, 15f by predetermined distances. The length of the second inner electrode 22b in the opposing direction of the third and fourth side faces 15e, 15f is substantially constant along the opposing direction of the first and second side faces 15c, 15d. The fourth inner electrode 22d has a structure similar to that of the second inner electrode 22b.

Figure 5:
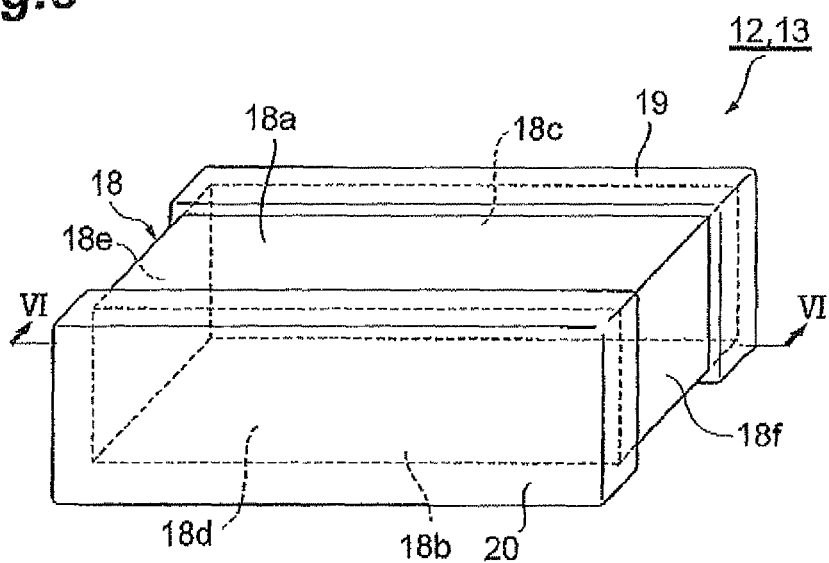
FIG. 5 is a perspective view illustrating a ferrite bead inductor used in the mounted structure represented in FIG. 1.

The ferrite bead inductors 12, 13 will now be explained in detail with reference to FIGS. 5 to 7. FIG. 5 is a perspective view illustrating a ferrite bead inductor, FIG. 6 is a sectional view taken along the line VI-VI of FIG. 5, and FIG. 7 is a view illustrating the layer structure of the ferrite bead inductor represented in FIG. 5.

Figure 6:
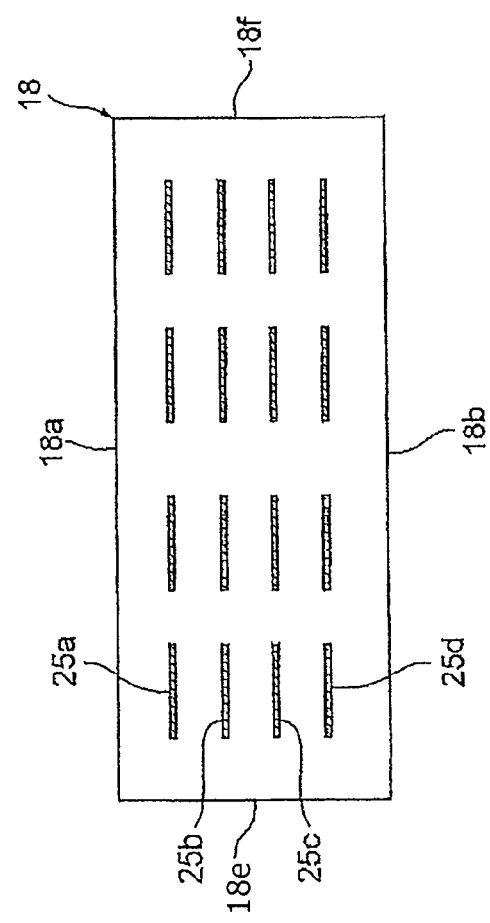
FIG. 6 is a sectional view of the ferrite bead inductor taken along the line VI-VI of FIG. 5.
Figure 7:
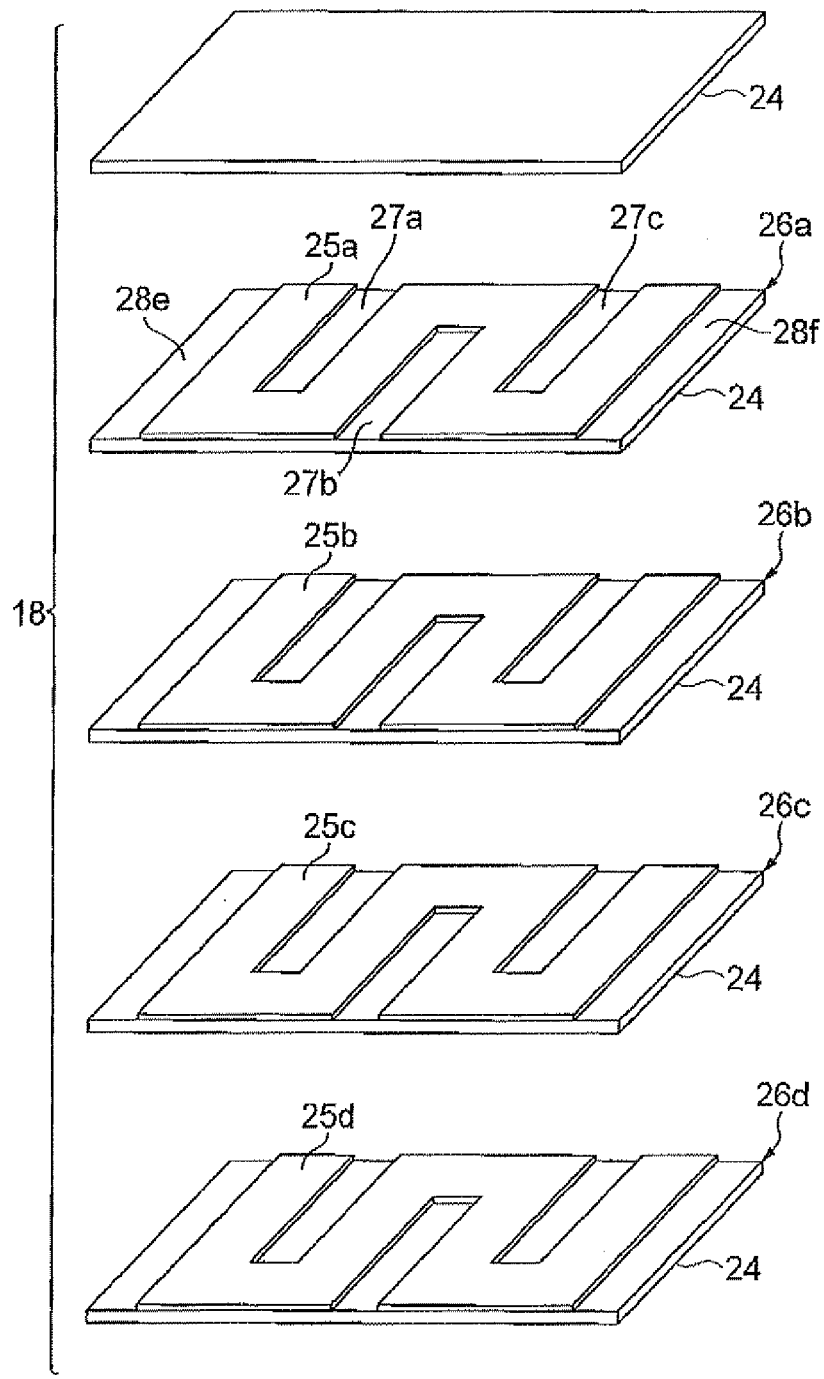
FIG. 7 is a view illustrating the layer structure of the ferrite bead inductor represented in FIG. 5.

As FIGS. 5 to 7 illustrate, each of the ferrite bead inductors 12, 13 is a multilayer chip ferrite inductor. As FIG. 5 illustrates, the ferrite bead element body 18 of the ferrite bead inductor 12 has oblong first and second main faces 18a, 18b opposing each other, first and second side faces 18c, 18d extending in the longer side direction of the first and second main faces 18a, 18b so as to connect them to each other and opposing each other, and third and fourth side faces 18e, 18f extending in the shorter side direction of the first and second main faces 18a, 18b so as to connect them to each other and opposing each other. The ferrite bead element body 18 of the ferrite bead inductor 13 has a structure similar thereto.

The first outer electrode 19 is formed on the first side face 18c side of the ferrite bead element body 18. The first outer electrode 19 covers the first side face 18c as a whole and continuously a part of the first and second main faces 18a, 18b and third and fourth side faces 18e, 18f. The second outer electrode 20 is formed on the second side face 18d side of the ferrite bead element body 18. The second outer electrode 20 covers the second side face 18d as a whole and continuously a part of the first and second main faces 18a, 18b and third and fourth side faces 18e, 18f. That is, the first and second outer electrodes 19, 20 are formed such as to be arranged on the longitudinal side faces 18c, 18d of the ferrite bead element body 18. The first and second outer electrodes 19, 20 of the ferrite bead inductors 12, 13 have a width equal to that of the first and second outer electrodes 16, 17 of the capacitors 10, 11.

As FIGS. 6 and 7 illustrate, the ferrite bead element body 18 is constructed by a plurality (4 here) of composite layers 26a to 26d, constituted by substantially oblong magnetic layers 24 and first to fourth inner electrodes 25a to 25d respectively formed thereon, and a magnetic layer 24 mounted as the outermost layer on the composite layers 26a to 26d so as to function as a protective layer. Each of the magnetic layers 24 is made of a sintered body of a sheet containing a ferrite material as a main ingredient, while each of the first to fourth inner electrodes 25a to 25d is made of a sintered body of a conductive paste. The ferrite bead element body 18 in practice is integrated to such an extent that boundaries between the magnetic layers 24 are indiscernible.

The composite layer 26a is a layer in which the first inner electrode 25a is formed on the magnetic layer 24. The composite layer 26b is a layer in which the second inner electrode 25b is formed on the magnetic layer 24. The composite layer 26c is a layer in which the third inner electrode 25c is formed on the magnetic layer 24. The composite layer 26d is a layer in which the fourth inner electrode 25d is formed on the magnetic layer 24. The first to fourth inner electrodes 25a to 25d are stacked successively while interposing the magnetic layers 24 in the stacking direction. As a consequence, the first to fourth inner electrodes 25a to 25d are arranged such as to be held between the magnetic layers 24 partly constituting the ferrite bead element body 18.

In the first inner electrode 25a, an oblong extending in the opposing direction of the first and second side faces 18c, 18d (parallel to the shorter side direction of the first and second main faces 18a, 18b) is partly formed with slit-shaped interstices 27a to 27c. The first inner electrode 25a extends so as to be drawn to both of the first and second side faces 18c, 18d of the ferrite bead element body 18, thereby connecting with the first and second outer electrodes 19, 20 electrically and mechanically. The first inner electrode 25a is arranged such as to be separated from the third and fourth side faces 18e, 18f by predetermined distances. Thus separated parts correspond to gap parts 28e, 28f on the magnetic layer 24, while the part other than the gap parts 28e, 28f is an inner electrode region S where the area of the inner electrode can be maximized on the magnetic layer 24 (see FIGS. 8a and 8b).

Each of the interstices 27a to 27c free of the conductive paste exhibits an oblong (strip) form whose longitudinal direction lies in the opposing direction of the first and second side faces 18c, 18d and is located within the above-mentioned inner electrode region S when seen in the stacking direction. Each of the interstices 27a, 27c is formed closer to the first side face 18c such as to expose one end at the first side face 18c, while the interstice 27b is formed closer to the second side face 18d such as to expose one end at the second side face 18d. Each of the second to fourth inner electrodes 25b to 25d has a structure similar to that of the first inner electrode 25a. When the composite layers 26a to 26d and the outermost magnetic layer 24 are stacked so as to form the ferrite bead inductors 12, 13, the interstices 27a to 27c of the first to fourth inner electrodes 25a to 25d become junctions where the magnetic layers 24 adjacent to each other in the stacking direction join together, thereby functioning to improve their adhesion.

Figure 9:
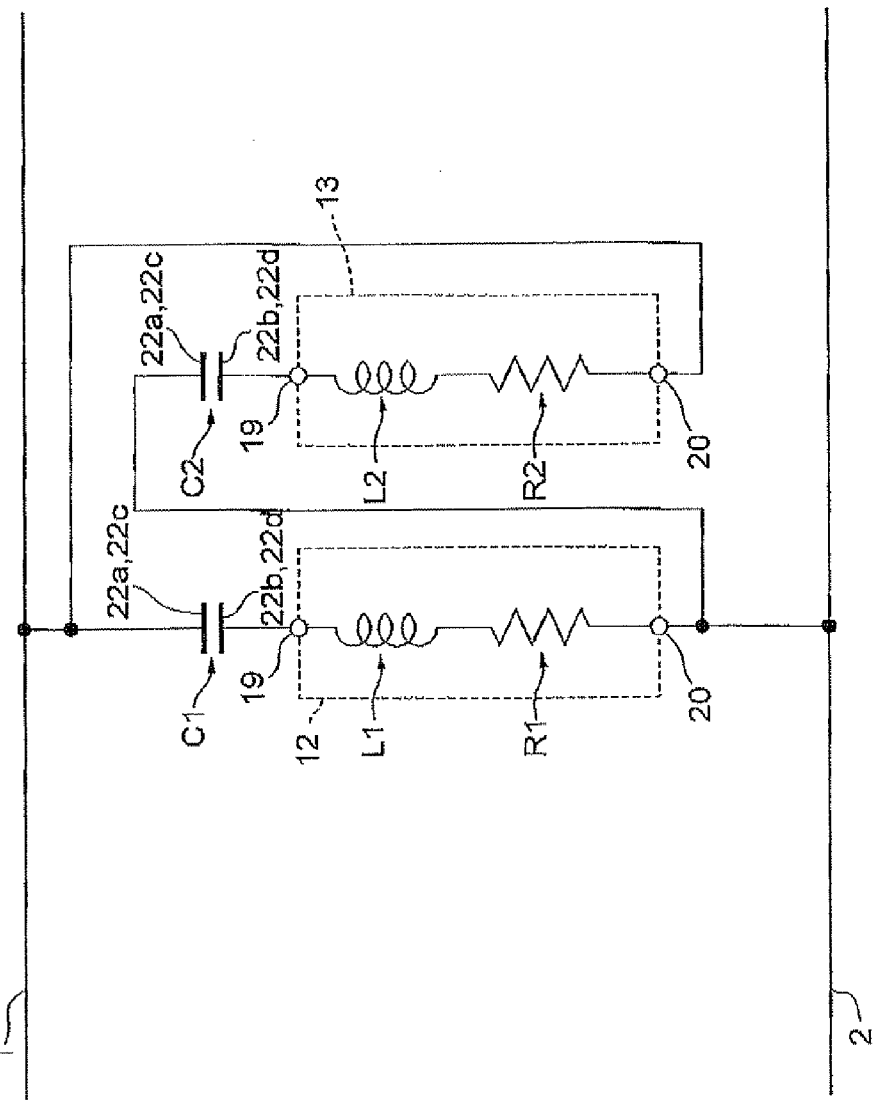
FIG. 9 is an equivalent circuit diagram of the mounted structure of an electronic component.

FIG. 9 is an equivalent circuit diagram of the mounted structure in this embodiment. As FIG. 9 illustrates, the capacitors 10, 11 form capacitances C1, C2. The ferrite bead inductors 12, 13 form inductor components L1, L2 and resistance components R1, R2 connected in series. The composite component of the inductor components L1, L2 and resistance components R1, R2 are connected in series to the capacitances C1, C2 of the capacitors 10, 11 between the power lines 1, 2. In the ferrite bead inductors 12, 13, the inductor components L1, L2 mainly act in a lower frequency band, while the resistance components R1, R2 mainly act in a higher frequency band.

In the mounted structure of an electronic component in accordance with this embodiment, as explained in the foregoing, the capacitors 10, 11 and ferrite bead inductors 12, 13 are connected in series between the power lines 1, 2, whereby the resistance components R1, R2 of the ferrite bead inductors 12, 13 act as the ESR (Equivalent Series Resistance) of the capacitors 10, 11. Each of the resistance components R1, R2 of the ferrite bead inductors 12, 13 is constituted by the sum of the DC resistance component and the loss increasing in the higher frequency band. Therefore, this mounted structure can increase the resistance component in the higher frequency band.

In this mounted structure, the ferrite bead inductors 12, 13 are mounted such that currents flow therethrough in directions opposite to each other, whereby the magnetic fields cancel each other out. Therefore, the ESL further decreases in the higher frequency band, which can prevent high frequency noises from being reflected, whereby the high frequency noises can be converted to heat by the resistance components, so as to be removed favorably. On the other hand, in the ferrite bead inductors 12, 13, the inductor components function more than the resistance components in the lower frequency band, whereby the above-mentioned mounted structure can keep the impedance low in the lower frequency band. Since the capacitors 10, 11 are mounted for the low frequency noises, the low frequency noises can be absorbed by the capacitors 10, 11, so as to be removed favorably.

The ferrite bead inductors 12, 13 used in this mounted structure can increase the width of the first and second outer electrodes 19, 20 and decrease the length of the inner electrodes 25a to 25d, thereby reducing the DC resistance component, which is one of resistance components of the bead inductors. That is, using the ferrite bead inductors 12, 13 can make the ESR further lower and higher in the lower and higher frequency bands, respectively.

In addition, the interstices 27a to 27c for the junctions at which the magnetic layers 24 adjacent to each other in the stacking direction join together are formed within the inner electrode region S where the first to fourth inner electrodes 25a to 25d can be formed in the ferrite bead inductors 12, 13. Therefore, while making the ESR lower and higher in the lower and higher frequency bands, respectively, thus constructed ferrite bead inductors 12, 13 can further prevent the magnetic layers 24 from causing interlayer peeling, thereby inhibiting internal defects from occurring in the bead inductors.

Operations and effects of the ferrite bead inductors 12, 13 will now be explained more specifically. As illustrated in FIGS. 8a and 8b, letting S0 be the area of the inner electrode region S on the magnetic layer 24, and S1 be the total area of the interstices 27a to 27c on the magnetic layer 24, it was determined, as listed in Table 1, in which range of the area ratio S1/S0 of the inner electrode region S to the interstices 27a to 27c the DC resistance component became smaller while internal structural defects were inhibited from occurring. Employed as samples for the determination were those having an outer size of 0.8 mm (L)×1.6 mm (W) (L0.8×W1.6; Nos. 1 to 7 in Table 1) and those having an outer size of 12 mm (L)×2.0 mm (W) (L1.2×W2.0; Nos. 8 to 14 in Table 1).

TABLE 1

| | Outer Size | S0 | S1 | S1/S0 | Number of internal structural defects occurred n = 100 | Rdc(mΩ) |
|---|---|---|---|---|---|---|
| 1 | L0.8 × W1.6 | 0.96 | 0.72 | 0.75 | 0/100 | 11.2 |
| 2 | L0.8 × W1.6 | 0.96 | 0.64 | 0.67 | 0/100 | 8.0 |
| 3 | L0.8 × W1.6 | 0.96 | 0.56 | 0.58 | 0/100 | 6.6 |
| 4 | L0.8 × W1.6 | 0.96 | 0.25 | 0.26 | 0/100 | 4.2 |
| 5 | L0.8 × W1.6 | 0.96 | 0.2 | 0.21 | 0/100 | 3.5 |
| 6 | L0.8 × W1.6 | 0.96 | 0.15 | 0.16 | 1/100 | 3.3 |
| 7 | L0.8 × W1.6 | 0.96 | 0.1 | 0.10 | 3/100 | 3.0 |
| 8 | L1.2 × W2.0 | 1.92 | 1.62 | 0.84 | 0/100 | 17.5 |
| 9 | L1.2 × W2.0 | 1.92 | 1.44 | 0.75 | 0/100 | 11.7 |
| 10 | L1.2 × W2.0 | 1.92 | 1.26 | 0.66 | 0/100 | 7.1 |
| 11 | L1.2 × W2.0 | 1.92 | 0.68 | 0.36 | 0/100 | 4.9 |
| 12 | L1.2 × W2.0 | 1.92 | 0.49 | 0.25 | 0/100 | 3.5 |
| 13 | L1.2 × W2.0 | 1.92 | 0.39 | 0.20 | 1/100 | 3.2 |
| 14 | L1.2 × W2.0 | 1.92 | 0.29 | 0.15 | 3/100 | 2.9 |

In this test for determination, using 100 each of the samples (n=100), the number of internal structural defects caused by interlayer peeling and the like and the DC resistance Rdc (mΩ) were determined while changing the area ratio S1/S0. As a result, the number of internal structural defects occurred could be kept low at about 0/100 to a few/100 in each of the sample Nos. 1 to 14 as listed in Table 1. In particular, the area ratio S1/S0 greater than 0.20 yielded a remarkable effect that the number of internal structural defects was 0/100, i.e., there were no internal structural defects.

While the DC resistance Rdc could be kept lower in each of the sample Nos. 1 to 14 as listed in Table 1, the area ratio S1/S0 of 0.67 or less could yield a remarkable effect of attaining the DC resistance lower than 10 mΩ, which was one of indexes for proving that the DC resistance was low, in particular.

Thus, letting S0 be the area of the inner electrode region S on the magnetic layer 24, and S1 be the total area of the interstices 27a to 27c on the magnetic layer 24, the area ratio S1/S0 of the inner electrode region S to the interstices 27a to 27c when greater than 0.20 but 0.67 or less can yield a remarkable effect of making the ESR lower and higher in the lower and higher frequency bands while preventing the magnetic layers 24 from causing interlayer peeling and inhibiting internal structural defects from occurring in the ferrite bead inductors 12, 13.

In the ferrite bead inductors 12, 13, each of the first and second outer electrodes 19, 20 is constituted by a single outer electrode. This can further lower the resistance value in the outer electrodes 19, 20, whereby the DC resistance components can be made smaller in the ferrite bead inductors 12, 13.

The first and second outer electrodes 16, 17 of the capacitors 10, 11 have a width equal to that of the first and second outer electrodes 19, 20 of the ferrite bead inductors 12, 13. When the width of the first and second outer electrodes 16, 17 of the capacitors 10, 11 and the width of the first and second outer electrodes 19, 20 of the bead inductors 12, 13 differ from each other, a high frequency current may be reflected between them without being converted into heat by the resistance components R1, R2 of the bead inductors 12, 13, which may lower the noise removing effect.

Since the first and second outer electrodes 16, 17 have a width equal to that of the first and second outer electrodes 19, 20 in this embodiment, however, the high frequency current can be prevented from being reflected between them, whereby the noise removing effect in the ferrite bead inductors 12, 13 can be improved.

In the capacitors 10, 11, the first and second outer electrodes 16, 17 are formed on the first and second side faces 15c, 15d, respectively. The first and second side faces 15c, 15d are longitudinal side faces of the capacitor element body 15. Therefore, the capacitors 10, 11 can further lower the ESL.

Second Embodiment

The ferrite bead inductors 12, 13 in accordance with the second embodiment will now be explained. In the ferrite bead inductors 12, 13 in accordance with this embodiment, the forms of first to fourth inner electrodes 35a to 35d differ from those of the inner electrodes 25a to 25d in the first embodiment. The differences from the first embodiment will mainly be explained in the following.

Figure 10:
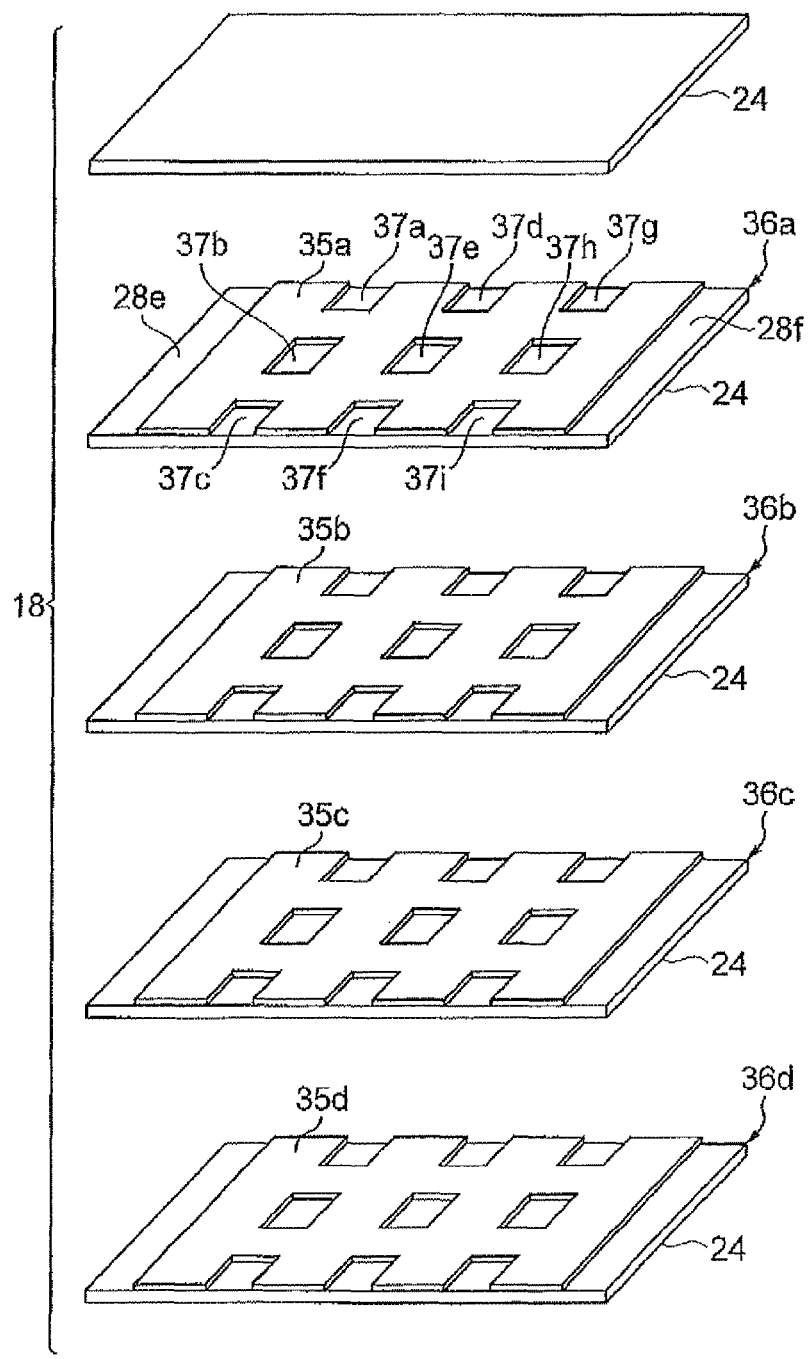
FIG. 10 is a view illustrating the layer structure of the ferrite bead inductor in accordance with a second embodiment.

As FIG. 10 illustrates, the ferrite bead element body 18 of each of the ferrite bead inductors 12, 13 is constructed by a plurality of composite layers 36a to 36d, constituted by substantially oblong magnetic layers 24 and first to fourth inner electrodes 35a to 35d respectively formed thereon, and a magnetic layer 24 mounted as the outermost layer on the composite layers 36a to 36d so as to function as a protective layer. The composite layers 36a to 36d are respective layers in which the first to fourth inner electrodes 35a to 35d are formed on the magnetic layers 24. The first to fourth inner electrodes 35a to 35d are stacked successively, while interposing the magnetic layers 24 in the stacking direction, whereby the first to fourth inner electrodes 35a to 35d are arranged such as to be held between the magnetic layers 24.

The first inner electrode 35a is a ladder-shaped electrode in which an oblong extending in the opposing direction of the first and second side faces 18c, 18d is partly provided with nine interstices 37a to 37i each having an oblong form. The first inner electrode 35a extends so as to be drawn to both of the first and second side faces 18c, 18d of the ferrite bead element body 18, thereby connecting with the first and second outer electrodes 19, 20 electrically and mechanically as in the first embodiment. The first inner electrode 35a is arranged such as to be separated from the third and fourth side faces 18e, 18f by predetermined distances.

The interstices 37a to 37i are arranged in three rows in the respective orders of the interstices 37a, 37b, 37c; 37d, 37e, 37f; and 37g, 37h, 37i from the first side face 18c to the second side face 18d. The interstices 37a to 37i are arranged such as to be located within the inner electrode region S when seen in the stacking direction as in the first embodiment. Each of the interstices 37a, 37d, 37g is formed such as to be exposed at the first side face 18c by one end. Each of the interstices 37c, 37f, 37i is formed such as to be exposed at the second side face 18d by one end. The interstices 37b, 37e, 37h are formed such as to be located at the center part in the opposing direction of the first and second side faces 18c, 18d without being exposed at any of them. The second to fourth inner electrodes 35b to 35d are constructed similar to the first inner electrode 35a.

As explained in the foregoing, since the inner electrodes 35a to 35d have the nine interstices 37a to 37i within the inner electrode region S so as to attain ladder forms, the ferrite bead inductors 12, 13 in accordance with this embodiment can more reliably connect together the magnetic layers 24 adjacent to each other in the stacking direction, as well as being able to reduce the DC resistance component, which is one of resistance components of the bead inductors, as in the first embodiment. As a result, this embodiment can prevent the magnetic layers 24 from causing interlayer peeling, thereby inhibiting internal defects from occurring in the bead inductors.

Third Embodiment

The ferrite bead inductors 12, 13 in accordance with the third embodiment will now be explained. In the ferrite bead inductors 12, 13 in accordance with this embodiment, the forms of first to fourth inner electrodes 45a to 45d differ from those of the inner electrodes 25a to 25d in the first embodiment. The differences from the first embodiment will mainly be explained in the following.

Figure 11:
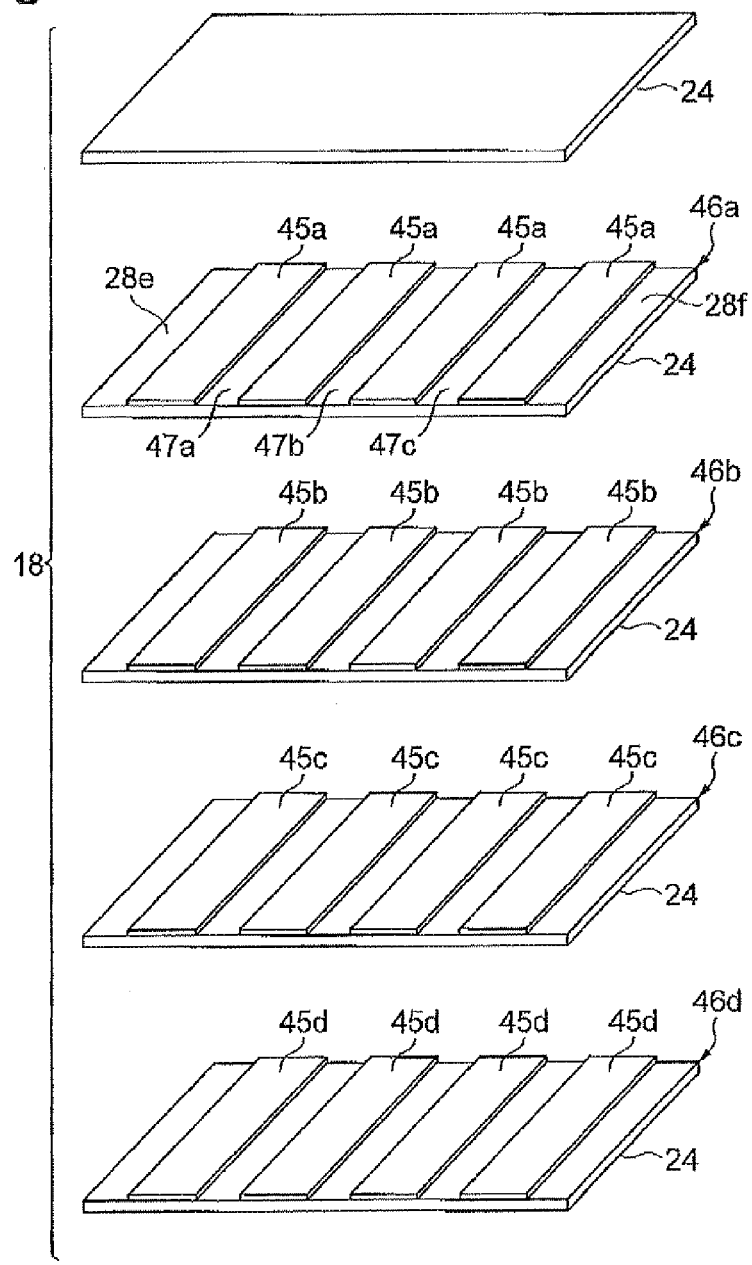
FIG. 11 is a view illustrating the layer structure of the ferrite bead inductor in accordance with a third embodiment.

As FIG. 11 illustrates, the ferrite bead element body 18 of each of the ferrite bead inductors 12, 13 is constructed by a plurality of composite layers 46a to 46d, constituted by substantially oblong magnetic layers 24 and first to fourth inner electrodes 45a to 45d formed thereon, and a magnetic layer 24 mounted as the outermost layer on the composite layers 46a to 46d so as to function as a protective layer. Each of the composite layers 46a to 46d is a layer in which a set of the first to fourth inner electrodes 45a to 45d are formed on the magnetic layer 4. That is, a plurality (4) of divided inner electrodes 45a to 45d are arranged on one magnetic layer 24.

Each of the first inner electrodes 45a is an electrode having an oblong (strip) form extending in the opposing direction of the first and second side faces 18c, 18d. The first inner electrode 45a extends so as to be drawn to both of the first and second side faces 18c, 18d of the ferrite bead element body 18, thereby connecting with the first and second outer electrodes 19, 20 electrically and mechanically. Interstices 47a to 47c are formed between the first inner electrodes 45a, while the first inner electrodes 45a located on the outer side in the opposing direction of the third and fourth side faces 18e, 18f are arranged such as to be separated from the third and fourth side faces 18e, 18f by predetermined distances.

The interstices 47a to 47c are slit-like interstices each having an oblong (strip) form extending in the opposing direction of the first and second side faces 18c, 18d and arranged such as to be located within the inner electrode region S as seen in the stacking direction as in the first embodiment and the like. Each of the interstices 47a to 47c is formed such as to be exposed at both of the first and second side faces 18c, 18d. The second to fourth inner electrodes 45b to 45d and the interstices therebetween are constructed similar to the first inner electrodes 45a and the interstices 47a to 47c therebetween.

As explained in the foregoing, since the interstices 47a to 47c formed between the inner electrodes 45a to 45d are located within the inner electrode region S, the ferrite bead inductors 12, 13 in accordance with this embodiment can more reliably connect together the magnetic layers 24 adjacent to each other in the stacking direction, as well as being able to reduce the DC resistance component, which is one of resistance components of the bead inductors, as in the first embodiment. As a result, this embodiment can prevent the magnetic layers 24 from causing interlayer peeling, thereby inhibiting internal defects from occurring in the bead inductors.

Fourth Embodiment

The ferrite bead inductors 12, 13 in accordance with the fourth embodiment will now be explained. In the ferrite bead inductors 12, 13 in accordance with this embodiment, the forms of first to fourth inner electrodes 53a to 53d and their places in the stacking direction differ from those of the inner electrodes 25a to 25d in the first embodiment. The differences from the first embodiment will mainly be explained in the following.

Figure 12:
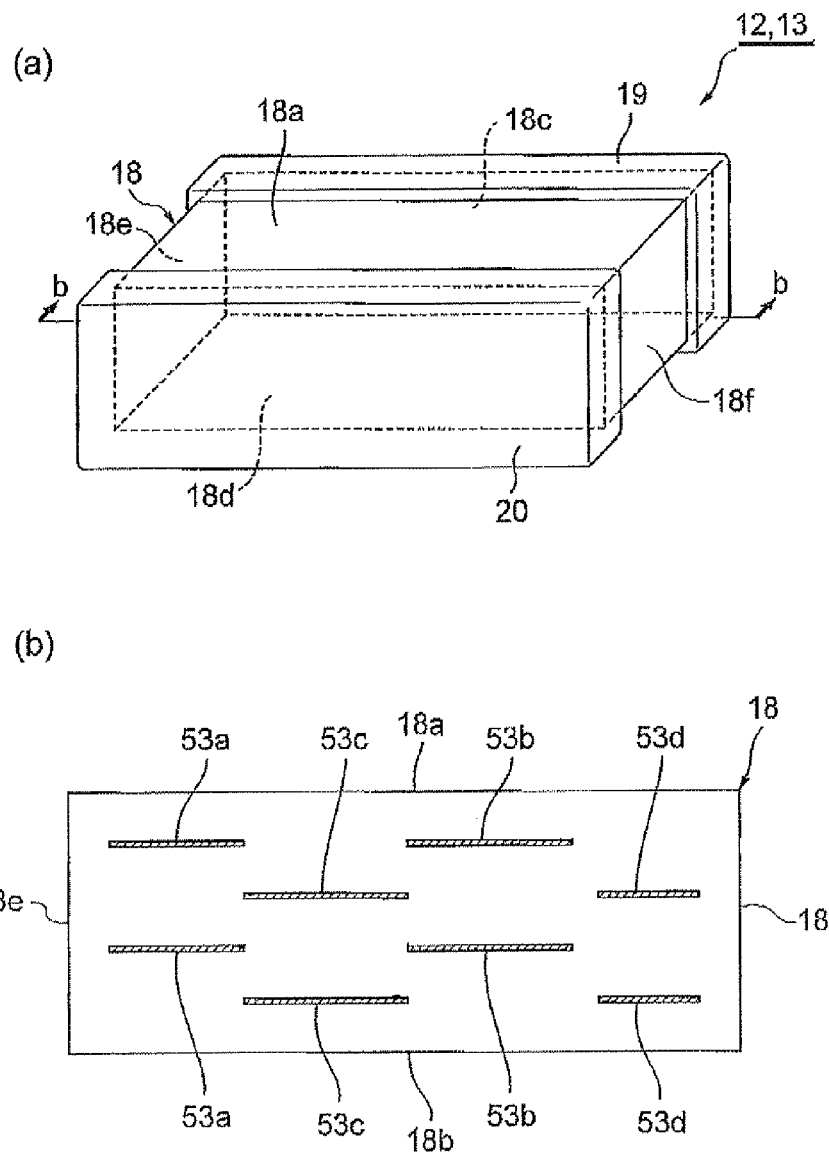
FIGS. 12a and 12b are views illustrating the layer structure of the ferrite bead inductor in accordance with a fourth embodiment.
Figure 13:
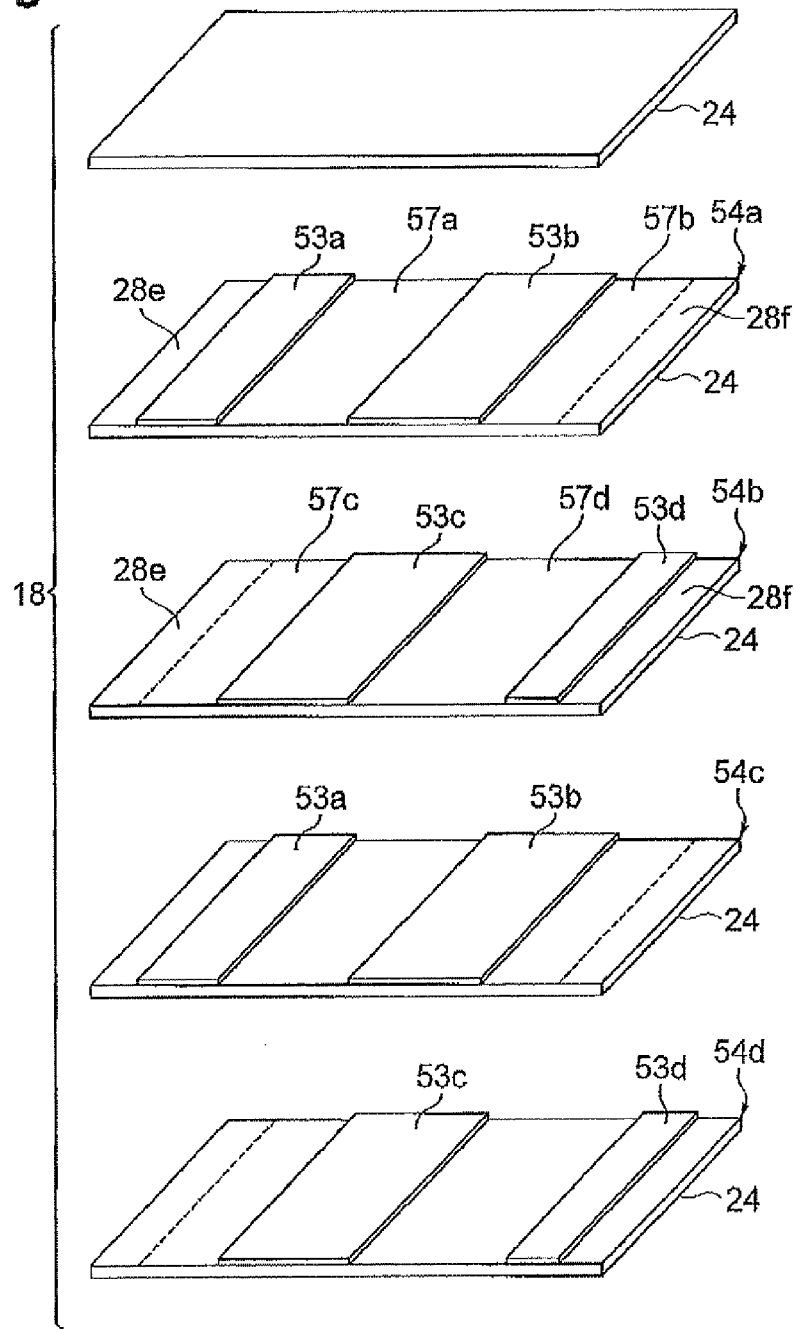
FIG. 13 is a view illustrating the layer structure of the ferrite bead inductor represented in FIGS. 12a and 12b.

As FIGS. 12a, 12b, and 13 illustrate, the ferrite bead element body 18 of each of the ferrite bead inductors 12, 13 is constructed by a plurality of composite layers 54a to 54d, constituted by substantially oblong magnetic layers 24 and inner electrodes 53a to 53d formed thereon, and a magnetic layer 24 mounted as the outermost layer on the composite layers 54a to 54d so as to function as a protective layer.

The composite layer 54a is a layer in which a plurality (2 here) of inner electrodes 53a, 53b are formed on the magnetic layer 24. The inner electrode 53a has an oblong shape and is formed on the magnetic layer 24 such as to have the longer side direction parallel to the shorter side direction of the first and second main faces 18a, 18b. The inner electrode 53a extends so as to be drawn to both of the first and second side faces 18c, 18d of the ferrite bead element body 18, thereby connecting with the first and second outer electrodes 19, 20 electrically and mechanically. The inner electrode 53b has an oblong shape and is formed on the magnetic layer 24 such as to have the longer side direction parallel to the shorter side direction of the first and second main faces 18a, 18b.

The inner electrode 53b has a width greater than that of the inner electrode 53a in the longer side direction of the first and second main faces 18a, 18b of the ferrite bead element body 18. The inner electrode 53b extends so as to be drawn to both of the first and second side faces 18c, 18d of the ferrite bead element body 18, thereby connecting with the first and second outer electrodes 19, 20 electrically and mechanically. An interstice 57a is formed between the inner electrodes 53a, 53b, while an interstice 57b is formed between the inner electrode 53b and the gap part 28f. The composite layer 54c is constructed similar to the composite layer 54a.

The composite layer 54b is a layer in which a plurality (2 here) of inner electrodes 53c, 53d are formed on the magnetic layer 24. The inner electrode 53c has an oblong shape and is formed on the magnetic layer 24 such as to have the longer side direction parallel to the shorter side direction of the first and second main faces 18a, 18b of the ferrite bead element body 18. The inner electrode 53c extends so as to be drawn to both of the first and second side faces 18c, 18d of the ferrite bead element body 18, thereby connecting with the first and second outer electrodes 19, 20 electrically and mechanically. The inner electrode 53d has an oblong shape and is formed on the magnetic layer 24 such as to have the longer side direction parallel to the shorter side direction of the first and second main faces 18a, 18b of the ferrite bead element body 18.

The inner electrode 53d has a width smaller than that of the inner electrode 53c in the longer side direction of the first and second main faces 18a, 18b of the ferrite bead element body 18. The inner electrode 53d extends so as to be drawn to both of the first and second side faces 18c, 18d of the ferrite bead element body 18, thereby connecting with the first and second outer electrodes 19, 20 electrically and mechanically. An interstice 57d is formed between the inner electrodes 53c, 53d, while an interstice 57c is formed between the inner electrode 53c and the gap part 28e. The composite layer 54d is constructed similar to the composite layer 54b.

In the ferrite bead element body 18, each pair of the inner electrodes 53a, 53a; 53b, 53b oppose each other through the magnetic layers 24 in the stacking direction, while each pair of the inner electrodes 53c, 53c; 53d, 53d oppose each other through the magnetic layers 24 in the stacking direction. That is, the inner electrodes 53a, 53b of the composite layers 54a, 54c are arranged at positions kept from overlapping the inner electrodes 53c, 53d of the composite layers 54b, 54d in the stacking direction.

As explained in the foregoing, the inner electrodes 53a to 53d are stacked alternately while interposing the magnetic layers 24 therebetween in the stacking direction in thus constructed ferrite bead inductors 12, 13 in accordance with this embodiment. Therefore, since the interstices 57a to 57d are located within the inner electrode region S, the ferrite bead inductors 12, 13 can more reliably connect together the magnetic layers 24 adjacent to each other in the stacking direction, as well as being able to reduce the DC resistance component, which is one of resistance components of the bead inductors, as in the first embodiment. As a result, this embodiment can prevent the magnetic layers 24 from causing interlayer peeling, thereby inhibiting internal defects from occurring in the bead inductors.

Figure 14:
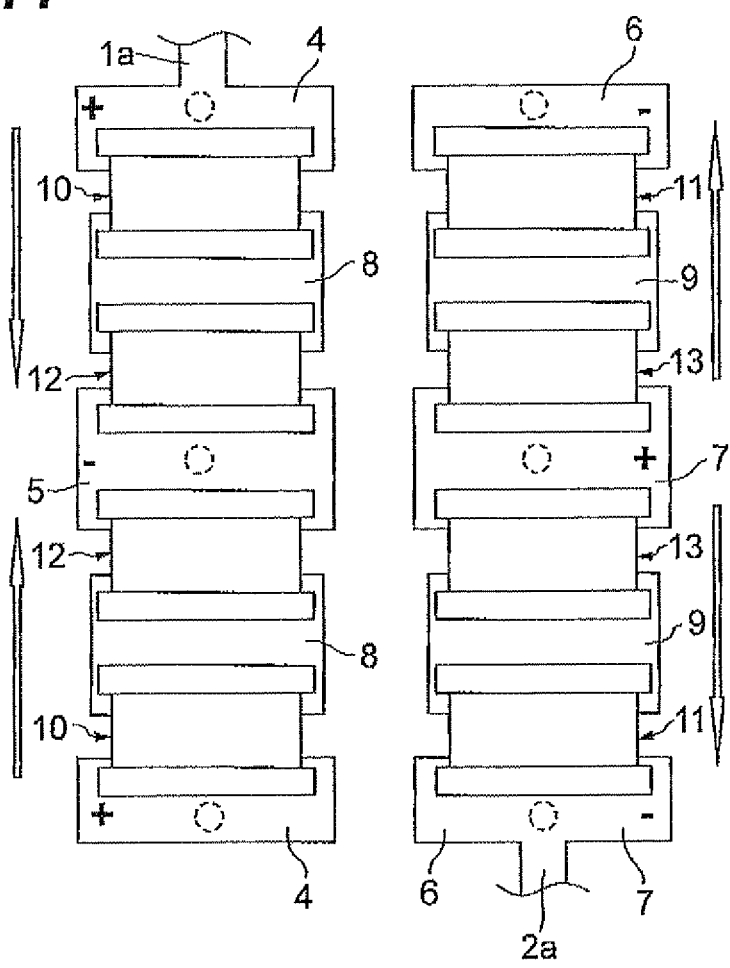
FIG. 14 is a view schematically illustrating the mounted structure of an electronic component in another mode.

The present invention is not limited to the above-mentioned embodiments. For example, a ferrite bead element body may be constituted by six composite layers instead of the four composite layers exemplified in the above-mentioned ferrite bead inductors 12, 13. The number of capacitors and ferrite bead inductors mounted in the above-mentioned mounted structure of an electronic component can be changed according to the design thereof. For example, as illustrated in FIG. 14, the capacitors 10, 11 and ferrite bead inductors 12, 13 may be mounted four each. Since the capacitors 10, 11 and the ferrite bead inductors 12, 13 are connected in series between the power lines 1, 2, while magnetic fields are canceled in the ferrite bead inductors 12, 13, such a structure can also reduce the ESL. This can yield higher impedance in a higher frequency band while keeping lower impedance in a lower frequency band.

Figure 15:
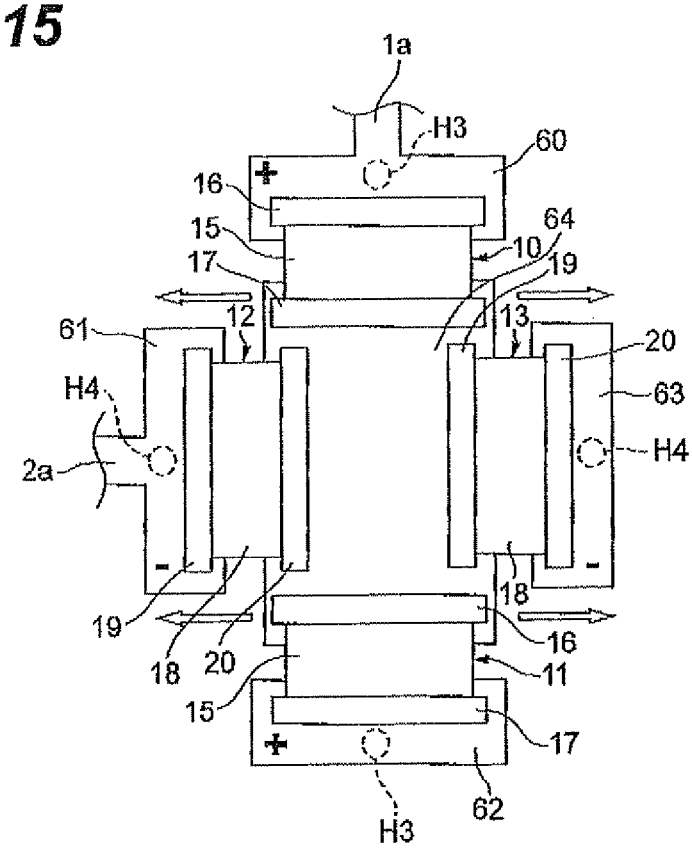
FIG. 15 is a view schematically illustrating the mounted structure of an electronic component in still another mode.

A mounted structure illustrated in FIG. 15 can also be employed. In this mounted structure, as electrode patterns, a lead 1a is connected to a first land electrode 60, a lead 2a is connected to a second land electrode 61, a third land electrode 62 is disposed on the same line as with the first land electrode 60, and a fourth land electrode 63 is disposed on the same line as with the second land electrode 61. The third land electrode 62 is electrically connected to the first land electrode 60 through a via hole H3, while the fourth land electrode 63 is electrically connected to the second land electrode 61 through a via hole H4. A connecting electrode 64 is disposed between the first and third land electrodes 60, 62 and between the second and fourth land electrodes 61, 63.

For mounting to such electrode patterns, the capacitor 10 is arranged such as to bridge the first land electrode 60 and the connecting electrode 64, while the capacitor 11 is arranged such as to bridge the connecting electrode 64 and the third land electrode 62. The ferrite bead inductor 12 is arranged such as to bridge the second land electrode 61 and the connecting electrode 64, while the ferrite bead inductor 13 is arranged such as to bridge the connecting electrode 64 and the fourth land electrode 63. This arrangement can also connect the capacitors 10, 11 and ferrite bead inductors 12, 13 in series between the power lines 1, 2 in the mounted structure, so that the capacitors 10, 11 and ferrite bead inductors 12, 13 can be connected in parallel to the IC chip 3. In addition, currents flow in the directions of arrows depicted in FIG. 15 in this mounted structure, so that magnetic fields cancel each other out in the ferrite bead inductors 12, 13, whereby the ESL can be reduced.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A multilayer electronic component comprising:
   a element body including magnetic layers and an inner electrode stacked such that the inner electrode is arranged between the magnetic layers and having substantially oblong first and second main faces opposing each other, first and second side faces extending in a longer side direction of the first and second main faces so as to connect the first and second main faces to each other and opposing each other, and third and fourth side faces extending in a shorter side direction of the first and second main faces so as to connect the first and second main faces to each other and opposing each other;
   a first outer electrode arranged on the first side face of the element body; and
   a second outer electrode arranged on the second side face of the element body;
   wherein the inner electrode extends in the shorter side direction so as to connect with the first and second outer electrodes;
   wherein the element body has a junction where the magnetic layers adjacent to each other in a stacking direction join together within an inner electrode region adapted to form the inner electrode on the magnetic layer; and
   wherein, letting S0 be the area of the inner electrode region on the magnetic layers, and letting S1 be the area of the junction on the magnetic layers, the area ratio S1/S0 of the junction to the inner electrode region is greater than 0.20 but 0.67 or less.

2. A multilayer electronic component according to claim 1, wherein each of the first and second outer electrodes is constituted by a respective outer electrode.

3. A multilayer electronic component according to claim 1, wherein the inner electrode is divided into a plurality of inner electrode portions on the magnetic layers.

4. A multilayer electronic component according to claim 1, wherein the inner electrode comprises a plurality of inner electrodes arranged on different layers of the magnetic layers to keep the plurality of inner electrodes from opposing each other through the magnetic layers located therebetween in the stacking direction.

5. A mounted structure of an electronic component connected to power lines for supplying a current, including a capacitor and a bead inductor;
   wherein the bead inductor comprises:
   a element body including magnetic layers and an inner electrode stacked such that the inner electrode is arranged between the magnetic layers and having substantially oblong first and second main faces opposing each other, first and second side faces extending in a longer side direction of the first and second main faces so as to connect the first and second main faces to each other and opposing each other, and third and fourth side faces extending in a shorter side direction of the first and second main faces so as to connect the first and second main faces to each other and opposing each other;
   a first outer electrode arranged on the first side face of the element body; and
   a second outer electrode arranged on the second side face of the element body;
   wherein the first and second outer electrodes have a width in the longer side direction;
   wherein the inner electrode extends in the direction of the shorter sides so as to connect with the first and second outer electrodes;
   wherein the element body has a junction where the magnetic layers adjacent to each other in the stacking direction join together within an inner electrode region adapted to form the inner electrode on the magnetic layers;
   wherein the capacitor and the bead inductor are connected in series between the power lines; and
   wherein, letting S0 be the area of the inner electrode region on the magnetic layers, and letting S1 be the area of the junction on the magnetic layers, the area ratio S1/S0 of the junction to the inner electrode region is greater than 0.20 but 0.67 or less.

6. A mounted structure of an electronic component according to claim 5, wherein the bead inductor further includes has a plurality of bead inductors and the plurality of bead inductors are mounted such that respective magnetic fields thereof cancel each other out.

7. A mounted structure of an electronic component according to claim 5, wherein the capacitor comprises:
   a capacitor element body including dielectric layers and an capacitor inner electrode stacked therein and having substantially oblong capacitor element body first and second main faces opposing each other, capacitor element body first and second side faces extending in a longer side direction of the capacitor element body first and second main faces so as to connect the capacitor element body first and second main faces to each other and opposing each other, and capacitor element body third and fourth side faces extending in a shorter side direction of the capacitor element body first and second main faces so as to connect the capacitor element body first and second main faces to each other and opposing each other;
   a first capacitor outer electrode arranged on the capacitor element body first side face side of the capacitor element body; and
   a second capacitor outer electrode arranged on the capacitor element body second side face side of the capacitor element body.

8. A mounted structure of an electronic component according to claim 7, wherein the first and second capacitor outer electrodes of the capacitor have a width substantially equal to that of the first and second outer electrodes of the bead inductor.

9. A mounted structure of an electronic component according to claim 5, wherein the bead inductor includes a first bead inductor and a second bead inductor, and the capacitor includes a first capacitor and a second capacitor.

10. A mounted structure of an electronic component according to claim 9, wherein the first capacitor and the first bead inductor are connected in series, and the second capacitor and the second bead inductor are connected in series.

11. A mounted structure of an electronic component according to claim 10, wherein the first bead inductor that is connected to the first capacitor in series, is arranged adjacent to the second bead inductor that is connected to the second capacitor in series, so that currents flowing through the first bead inductor and the second bead inductor flow in directions opposite to each other.

12. A mounted structure of an electronic component according to claim 9, the mounted structure further comprising:
 a first lead connected to a first power line of the power lines;
 a first land electrode which is connected to the first capacitor;
 a second lead connected to a second power line of the power lines;
 a second land electrode which is connected to the first bead inductor;
 a third land electrode which is disposed in parallel with the first land electrode, the third land electrode being connected to the second capacitor; and
 a fourth land electrode which is disposed in parallel with the second land electrode, the fourth land electrode being connected to the second bead conductor.

13. A mounted structure of an electronic component according to claim 12, wherein the fourth land electrode is connected to the first land electrode through a first via hole, and the third land electrode is connected to the second land electrode through a second via hole.

* * * * *